(12) United States Patent
Tuominen et al.

(10) Patent No.: US 7,719,851 B2
(45) Date of Patent: May 18, 2010

(54) ELECTRONICS MODULE AND METHOD FOR MANUFACTURING THE SAME

(75) Inventors: Risto Tuominen, Helsinki (FI); Antti Iihola, Helsinki (FI)

(73) Assignee: Imbera Electronics OY, Espoo (FI)

( * ) Notice: Subject to any disclaimer, the term of this patent is extended or adjusted under 35 U.S.C. 154(b) by 729 days.

(21) Appl. No.: 11/587,586

(22) PCT Filed: Apr. 27, 2005

(86) PCT No.: PCT/FI2005/000200

§ 371 (c)(1),
(2), (4) Date: Feb. 1, 2007

(87) PCT Pub. No.: WO2005/104636

PCT Pub. Date: Nov. 3, 2005

(65) Prior Publication Data

US 2008/0192450 A1  Aug. 14, 2008

(30) Foreign Application Priority Data

Apr. 27, 2004  (FI) .................................. 20040592
Dec. 29, 2004  (FI) .................................. 20041680

(51) Int. Cl.
*H05K 1/18* (2006.01)

(52) U.S. Cl. ...................... 361/761; 361/728; 361/760; 361/767; 361/768; 174/262; 174/259; 29/874; 29/842; 29/831; 29/882

(58) Field of Classification Search ................ 361/704, 361/710, 719, 728, 729, 735, 760, 761, 763, 361/764, 767, 768, 790–795, 808; 174/260–266, 174/250, 255, 257, 259; 29/25.42, 858, 848, 29/842, 854, 857, 874, 884

See application file for complete search history.

(56) References Cited

U.S. PATENT DOCUMENTS

| 5,248,852 | A  | 9/1993  | Kumagai |
| 5,426,263 | A  | 6/1995  | Potter et al. |
| 5,497,033 | A  | 3/1996  | Fillion et al. |
| 6,038,133 | A  | 3/2000  | Nakatani et al. |
| 6,284,564 | B1 | 9/2001  | Balch et al. |

(Continued)

FOREIGN PATENT DOCUMENTS

EP  1 137 332 A1  9/2001

(Continued)

*Primary Examiner*—Dameon E Levi
*Assistant Examiner*—Hoa C Nguyen
(74) *Attorney, Agent, or Firm*—Birch, Stewart, Kolasch & Birch, LLP

(57) ABSTRACT

This publication discloses an electronics module and a method for manufacturing it. The electronics module includes at least one component (6) embedded in an insulating-material layer (1), which has a first contacting surface, in which there are first contact terminals (7), from which the component (6) is connected electrically to the conductor structures contained in the electronics module. In addition, the component (6) has a second contacting surface opposite to the first contacting surface, in which there is at least one second contact terminal (7'), from which the component (6) is connected electrically to the conductor structures contained in the electronics module. With the aid of the invention, it is possible to achieve an electronic-module construction that saves space compared to the prior art.

8 Claims, 5 Drawing Sheets

U.S. PATENT DOCUMENTS

Figure 1:
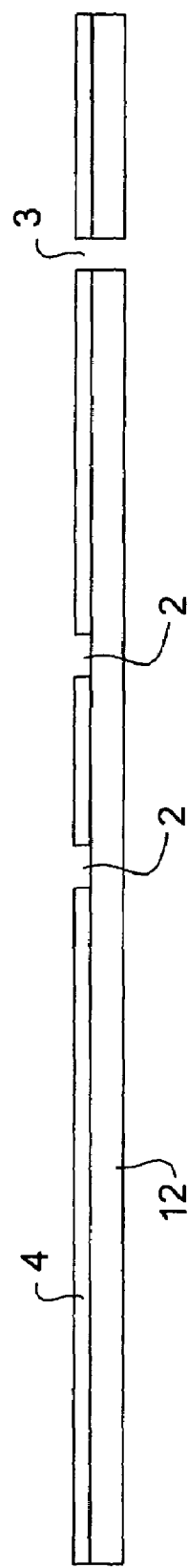
Figure 2:
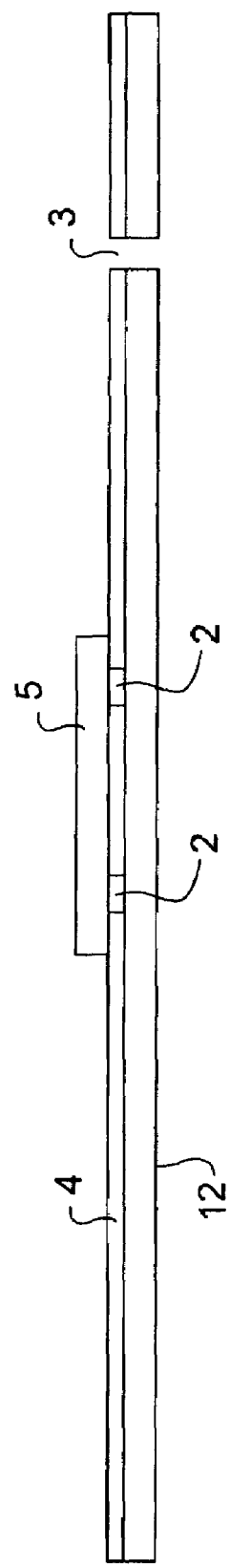

| | | |
|---|---|---|
| 6,489,685 B2 | 12/2002 | Asahi et al. |
| 6,690,583 B1 * | 2/2004 | Bergstedt et al. ............ 361/763 |
| 6,701,614 B2 | 3/2004 | Ding et al. |
| 6,876,072 B1 | 4/2005 | Wang et al. |
| 6,996,902 B2 * | 2/2006 | Suzuki et al. ................. 29/852 |
| 7,122,748 B2 * | 10/2006 | Yamada ...................... 174/521 |
| 7,348,213 B2 * | 3/2008 | Komatsu .................... 438/106 |
| 2002/0011351 A1 * | 1/2002 | Ogawa et al. .............. 174/260 |
| 2002/0135058 A1 | 9/2002 | Asahi et al. |
| 2003/0090883 A1 * | 5/2003 | Asahi et al. ................. 361/761 |
| 2003/0159852 A1 | 8/2003 | Nakamura |
| 2004/0027813 A1 | 2/2004 | Li |
| 2005/0006142 A1 | 1/2005 | Ishimaru et al. |

FOREIGN PATENT DOCUMENTS

| | | |
|---|---|---|
| JP | 2001-332866 A | 11/2001 |
| WO | WO-2004/089048 A1 | 10/2004 |
| WO | WO-2005/010987 A1 | 2/2005 |

* cited by examiner

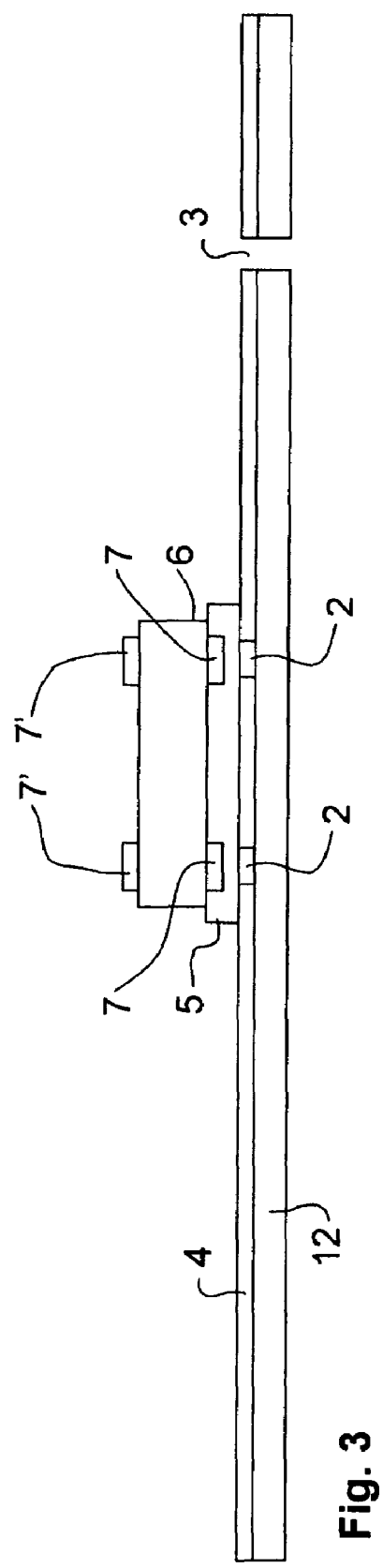
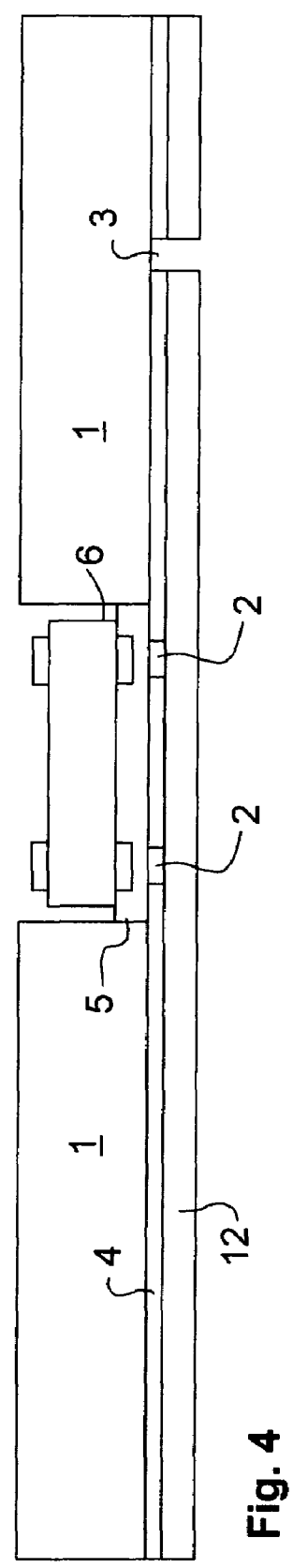
Fig. 3
Fig. 4

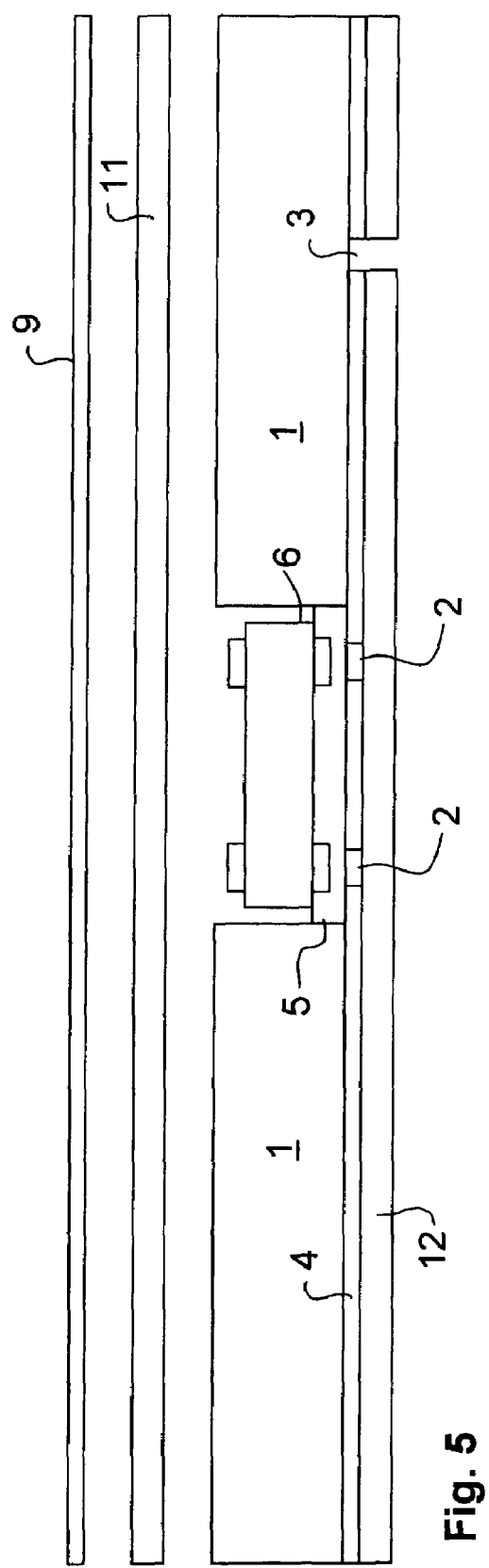
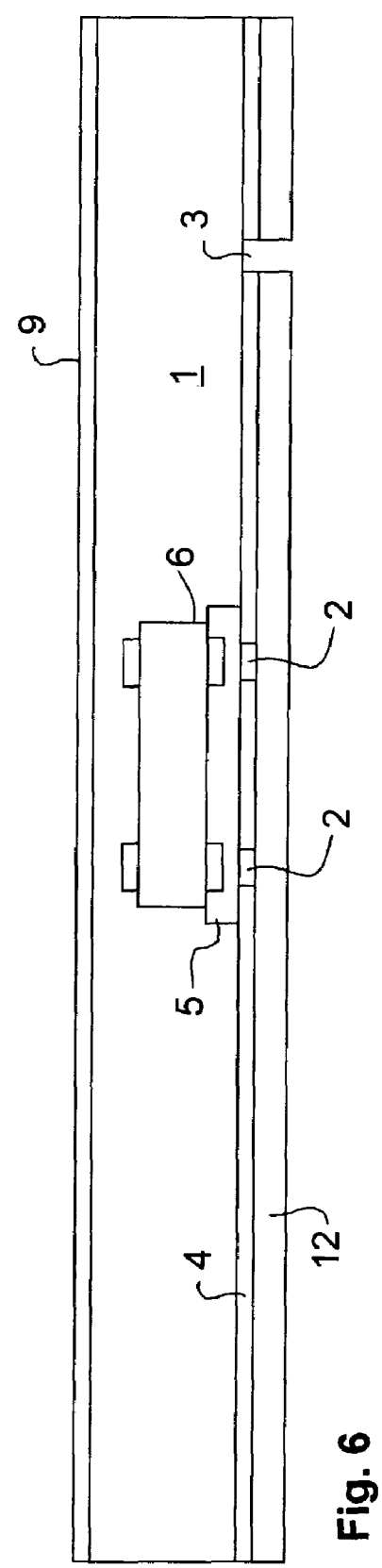
Fig. 5
Fig. 6

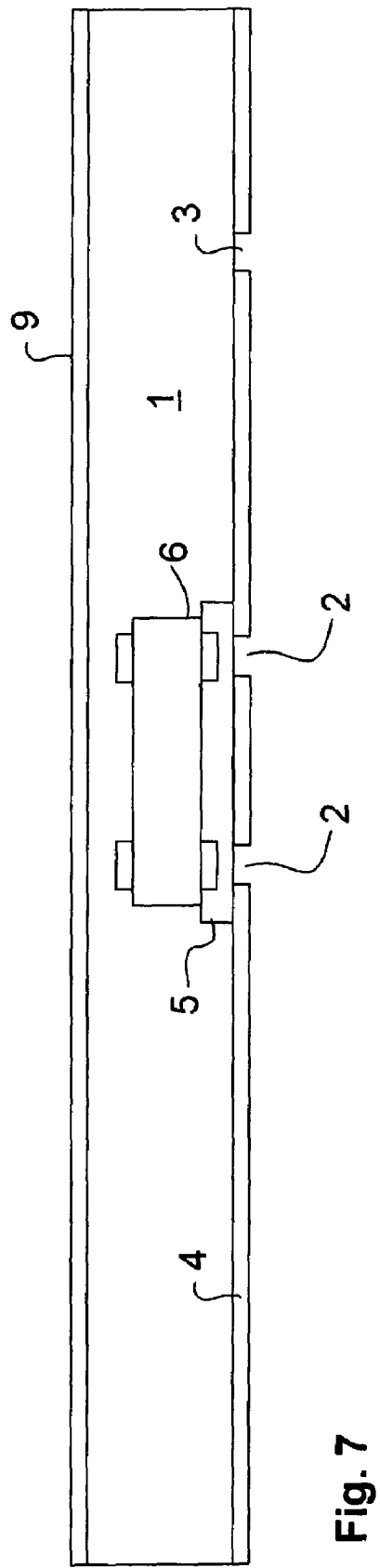
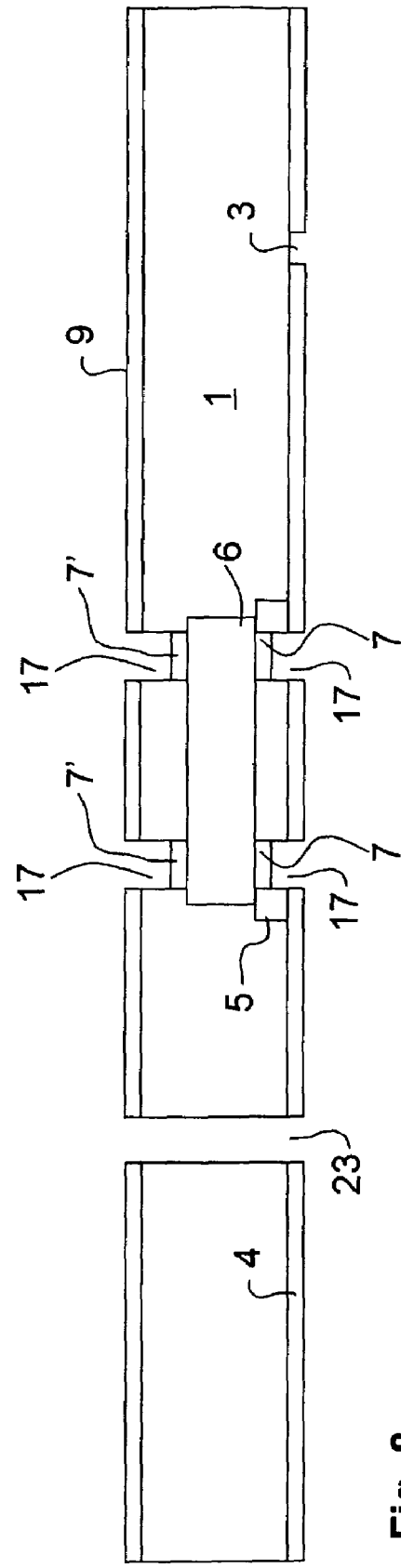

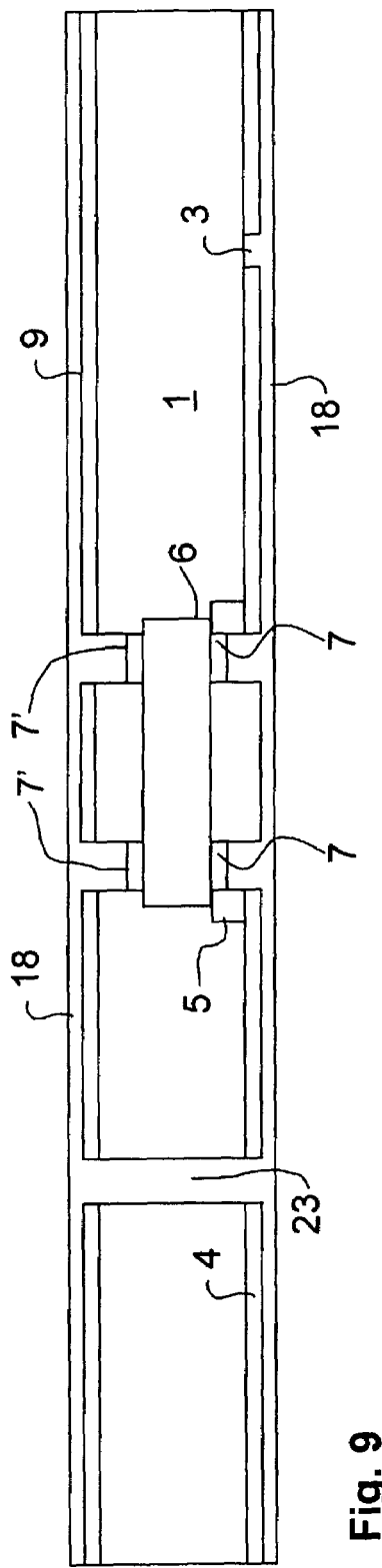
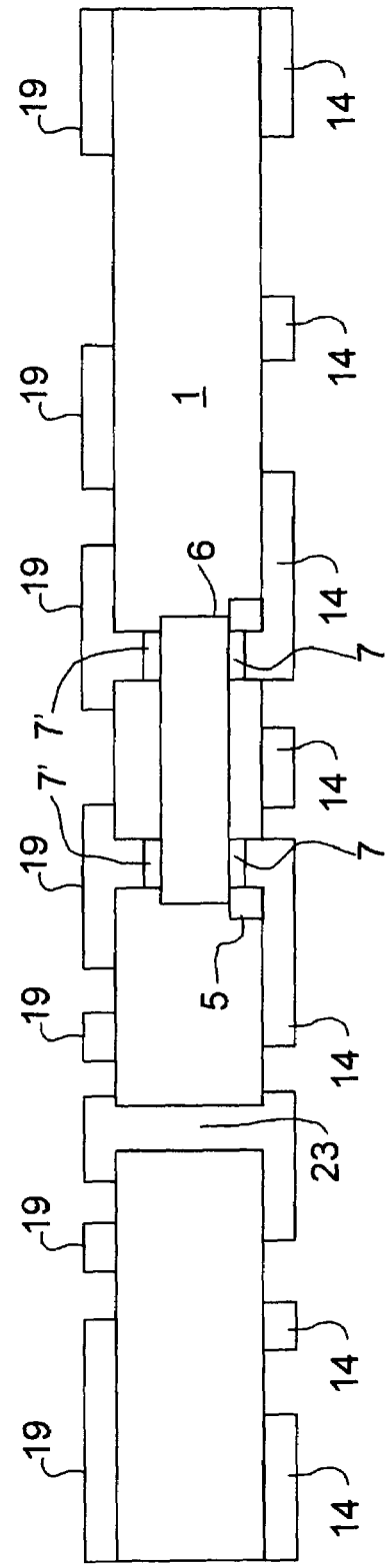

ELECTRONICS MODULE AND METHOD FOR MANUFACTURING THE SAME

The present invention relates to an electronics module, according to claim 1, which contains embedded components.

An electronics module of this kind can be a module like a circuit board, the components contained by which are connected to each other electrically through conductor structures made in the electronics module. The invention particularly relates to an electronics module, which contains microcircuits, to which several contact terminals are connected. In addition to, or instead of microcircuits, also other components, for example passive components, can be embedded in the installation base of the electronics module.

In addition, the invention relates to a method according to the preamble to claim 12 for manufacturing such an electronics module.

Known methods, in which components are embedded an installation base during the creation of the base, are disclosed in patent applications WO 03/065778 and WO 03/065779, as well as in patent publications U.S. Pat. No. 6,038,133 and U.S. Pat. No. 6,489,685. With the aid of the methods disclosed in the publications, it is possible to manufacture, for example, multi-layer circuit boards, inside which integrated microcircuits, for example microprocessors and memory circuits, are embedded. The components are connected electrically to conductor structures made in the surface of the installation base, with the aid of vias. Patent publication U.S. Pat. No. 6,292,366 discloses a circuit board, which includes a rigid layer, which is made from two aluminium sheets on top of each other. Microcircuits positioned next to each other are attached to the rigid layer, in such a way that their contact terminals point in opposite directions. Thanks to the construction, the microcircuits can be set in two layers and connected directly on both sides of the metal sheet acting as an installation base.

In the techniques disclosed in the aforesaid publications, components are used, in which there is one contacting surface, i.e. their contact terminals are located essentially on one side of the component. These contact terminals can be connected directly only to the conductor structures and contact surfaces of one surface of the base, in order to create electrical connection between the components and going outside the module. If it is wished to connect such a component electrically to the other surface of the base as well, this must be done through separate vias. The vias then take up space on the circuit board, as they cannot be made at the positions of the components on the board, without damaging the components. If the components are set in two layers, in order to optimize the use of the surface area of the circuit board, the electronic-module construction may become disadvantageously thick and complicated to manufacture. For this reason, circuit boards that include embedded components are not optimal in many such applications, in which the aim is to minimize the size of an electronic product.

Industry therefore has a great need to reduce the size of circuit boards by placing components in them in less space than before.

The invention is intended to make possible an electronic-module construction that will save more space than the prior art.

The invention is based on the idea of embedding in an insulating material layer a component, which has a first contacting surface, on which there are first contact terminals, and a second contacting surface, on which there is at least one second contact terminal, and which is opposite to the first contacting surface. In addition, the component is connected electrically from its contact terminals to the conductor structures contained in the electronics module.

Preferably, the contact terminals on the first contacting surface of the component are in direct contact with the conductor structures of the first surface of the base and the contact terminals on the second contacting surface of the component are in direct contact with the conductor structures on the second surface of the base.

First of all, a component can be put on top of the first conductor layer forming the first surface of the base, after which insulating material and a conductor layer forming the second surface of the base are put onto the first surface of the base, in such a way that the insulating material surrounds the component. Holes can be made through the conductor layers situated on both sides of the insulating layer, as far as the level of the surface of the contact terminals of the components, and additional insulating material can be put into these holes, in order to connect the components electrically to the conductor layers. In the final stage, the desired circuit pattern can be created in the conductor layers on both sides of the base.

More specifically, the electronics module according to the invention is characterized by what is stated in the characterizing portion of claim 1.

The manufacturing method of the electronics module according to the invention is, in turn, characterized by what is stated in claim 12.

Considerable advantages are gained with the aid of the invention.

The component to be embedded, for example, a microprocessor or memory circuit, can include, for example, tens or hundreds of contact terminals, so that in terms of the size of the circuit, it is often advantageous to manufacture the contact terminals on both sides of the component. In the electronics module according to the invention, such two-sided components can be utilized, when the module will be thin and the surface area of both the components and the electronics module can be effectively exploited.

According to one embodiment, the component can be glued to the first conductor layer. The adhesive can be insulating, or isotropically or anisotropically conductive.

According to one embodiment, the particles contained in the adhesive that may be in the contact area are exploited in creating an electrical contact between the component and the electronics module, in which case the contact is generally formed with the aid of heat and pressure. Always depending on the application, the electrical contact can be achieved not only with the aid of electrically conductive adhesive, but also of a metallurgical joint, for example, an ultrasound joint or thermo-compression, or even with solder. The possible adhesive can be put between the component and the conductor layer also after the creation of the electrical contact.

According to some embodiments, vias are formed, in conductor layers forming the first and/or second surfaces of the base, at the positions of the contact terminals of the components, before the attachment of the component. This is possible, because the positions of the contact terminals on both sides of the two-sided components are known very precisely. This in turn permits more reliable contacting between the contact terminals of the components and the conductor layers.

In some embodiments, there is a similar contact terminal pattern on both surfaces of the component being embedded while similar contact patterns can be manufactured on both surfaces of the base. Several of such electronics modules can further be connected on top of each other, to form an operational totality, which in turn brings new opportunities for efficient electronic design. The modules can of course also be connected on top of each other, even if the contact patterns of the conductor layers being attached to each other were to be different.

Other advantages of the invention are described later in connection with the more detailed description of the various embodiments.

Heretofore and hereinafter the term 'hole' can refer not only to a hole that extends through the structure, but also to a recess, which is created, for example, by drilling or with the effect of a laser, and which need not extend through the structure (the base or some other layer) in question.

The components' contact terminals can be, for example, protrusions, such as bumps, or other kinds, for example flat contact areas, on the surface of the component. The term contacting surface of the component, on the other hand, refers to a surface of the component, which includes at least one contact terminal, or in the direction of the surface of which at least one contact terminal can be approached in order to create an electrical contact, for example, by using the method disclosed in this application.

The term upper surface refers to one surface of the module, module blank, or component while the term lower surface refers to the opposite surface to this. Generally, the terms 'upper' and 'lower' refer to the directions according to the accompanying figures, or which are apparent from them. In the following, the invention is examined with the aid of examples and with reference to the accompanying drawings.

FIGS. 1-10 show a series of cross-sections of some examples of the application of the invention, in connection with one manufacturing method.

STAGE A (FIG. 1)

In stage A, a suitable conductor layer 4 is selected as the starting material for the process. A layered sheet, in which the conductor layer 4 is located on the surface of a support base 12, can also be selected as the starting material. The layered sheet can be manufactured, for example, by taking a support base 12 suitable for processing and attaching a suitable conductor membrane to the surface of this support base 12, for the creation of a conductor layer 4.

The support base 12 can be, for example, of an electrically conductive material, such as aluminium (Al), or of an insulating material, such as a polymer. The conductor layer 4 can be created, for example by attaching thin metal foil to one surface of the support base 12, for example, by laminating it from copper (Cu). The metal foil can be attached to the support base, for example, by using an adhesive layer, which is spread on the surface of the support base 12 or metal foil, prior to the lamination of the metal layer. At this stage, there need be no patterns in the metal foil.

In the example of FIG. 1, holes 3, which penetrate the support base 12 and the conductor layer 4, are made in the base, for alignment during the installation and connection of the components 6. For example, two through-holes 3 can be made for each component 6 to be installed. The holes 3 can be made using some suitable method, for example, mechanically by milling, stamping, drilling, or with the aid of a laser. However, it is not essential to make through-holes 3, instead other suitable alignment markings can also be used to align the components. In the embodiment shown in FIG. 1, the through-holes 3 used to align the components extend through both the support base 12 and the conductor membrane 4. This has the advantage that the same alignment marks (through-holes 3) can be used in aligning on both sides of the installation base.

In stage A in the preferred embodiment, contact holes 2 are also made in the conductor layer 4 for the components 6, at the positions of the contact terminals 7 of the components 6. The holes 2 can extend through the conductor layer 4, or be recesses on that side of the conductor layer, to which the components 6 will be glued at a later stage. If the contacting holes are made in the conductor layer 4 already at this stage, there is no danger that the drilling will damage the components. For example, when using laser drilling, a tolerance of about 5 μm is associated with drilling at typical drilling depths. When proceeding in this way, it is either possible to avoid making contacting holes entirely, or at least make it easier to create contacts to this side of the base.

Stage A can also be performed in the same way in embodiments, in which a self-supporting conductor layer 4 is used and which thus entirely lack the support layer 12.

STAGE B (FIG. 2)

In stage B, an adhesive layer 5 is spread on the conductor layer 4, in the areas to which the components 6 are to be attached. These areas can be termed connection areas. The adhesive layers 5 can be aligned, for example, with the aid of through-holes 3. The thickness of the adhesive layer is selected in such a way that the adhesive completely fills the space between the component 6 and the conductor layer 4, when the component 6 is pressed onto the adhesive layer 5. If the component 6 includes contact protrusions 7, the thickness of the adhesive layer 5 should be greater, for example, 1.5-10 times, than the height of the contact protrusions 7, so that the space between the component 6 and the conductor layer 4 will be well filled. The surface area of the adhesive layer 5 formed for the component 6 can also be slightly greater than the surface area corresponding to the component 6, which will also help to reduce the risk of inadequate filling.

The adhesive used in the embodiments is typically a heat-cured epoxy, for example, NCA (non conductive adhesive). The selection of the adhesive must ensure that the adhesive used will adhere sufficiently to the conductor membrane, the circuit-board, and the component. One preferred property of the adhesive is a suitable thermal expansion coefficient, so that during the process the thermal expansion of the adhesive will not differ excessively from the thermal expansion of the surrounding material. The adhesive selected should also preferably have a short curing time of at most a few seconds. Within this time, the adhesive should harden at least partly to an extent that will allow the adhesive to hold the component in place. The final hardening can take a clearly longer time and indeed the final curing can be planned to occur in connection with the later process stages. The adhesive should also withstand the process temperatures used, for example, heating to a temperature of 100-265° C. a few times, as well as other stresses, for example, chemical and mechanical stress, in the manufacturing process. The electrical conductivity of the adhesive should preferably be of the same order as that of the insulating materials.

Stage B can be modified in such a way that the adhesive layer 5 is spread on the connector surfaces of the components 6, instead of on the connector areas of the conductor layer 4. This can be performed, for example, in such a way that the component is dipped in adhesive before it is assembled in place in the electronics module. It is also possible to proceed by spreading the adhesive on both the connector areas of the conductor layer 4 and on the connector surfaces of the components 6.

The adhesive used is thus an electrical insulator, so that electrical contacts between the contacting terminals of the component 6 do not arise in the adhesive layer 5 itself.

STAGE C (FIG. 3)

In stage C, the components 6 are set in place in the electronics module. This can be done, for example, by using the aid of an assembly machine to press the components 6 into the adhesive layer 5. In the assembly stage, the through-holes 3 made for alignment, or other available alignment marks are used to align the component 6.

The components 6 can be glued singly, or in suitable groups. The typical procedure is for the conductor layer, which can be referred to as the bottom of the installation base, to be brought to a suitable position relative to the assembly machine, after which the component 6 is aligned and pressed onto the bottom of the installation base, which is held stationary during alignment and attachment.

The components 6 are preferably assembled on the installation base in such a way that the contact surfaces of their contact terminals 7 come close to the surface of the component 6 side of the conducting layer 4 (or to holes 2 that may have been made in it). According to a particularly preferred embodiment, the contact terminals 7 are assembled essentially in direct contact with the conductor layer 4. In the embodiment show in FIG. 3, a thin layer of adhesive is left between the contact terminals 7 and the conductor layer 4.

STAGE D (FIG. 4)

In FIG. 4, an insulating-material layer 1, in which there are ready-made holes 2 or recesses for the components 6 glued to the conductor layer 4, is placed on top of the conductor layer 4. The insulating-material layer 1 can be manufactured from a suitable polymer base, in which holes or recesses, selected according to the size and position of the components 6, are manufactured using some suitable method. The polymer base can be, for example, a pre-preg base, which is known and widely used in the circuit-board industry, which is made from a glass-fibre mat and so-called b-state epoxy. It is best to perform stage D only after the adhesive layer 5 has been cured, or otherwise hardened sufficiently for the components 6 to remain in place while the insulating-material layer 1 is set in place.

STAGE E (FIG. 5)

According to one embodiment, in stage E, an unpatterned insulating-material layer 11 is set on top of the insulating-material layer 1 and then a conductor layer 9 is set on top of it. Like the insulating-material layer 1, the insulating-material layer 11 can be manufactured from a suitable polymer membrane, for example, from the aforementioned pre-preg base. The conductor layer 9 can be, for example, copper foil, or some other membrane suitable for the purpose. The insulating material layer 11 is preferably thin, so that the distance between the contact terminals 7' and the conductor layer 9 will not become great, in which case the making, at a later stage, of holes 17 through the insulating material layer and the arranged of the conductor material will be facilitated.

It has been observed that it is particularly advantageous if the thickness of the layer remaining between the contact terminals 7 and the conductor layer 4, and the contact terminals 7' and the conductor layer 9 is less that the diameter of the holes made in it, generally being less than 50 μm, typically less than 30 μm, and even less than 20 μm. If the depth of the holes is substantially greater than their diameter, it is more difficult to manufacture holes, and thus vias, of good quality.

According to one preferred embodiment, the contact terminals 7' of the component 6' come in stage E essentially in contact with the conductor layer 9, so that the making of a good electrical contact between the contact terminals and the conductor layer is further facilitated.

In some embodiments, the insulating layer 11 can be entirely omitted.

STAGE F (FIG. 6)

In stage F, the layers 1 and 9, as well as the layer 11 that may possibly remain between them, are pressed with the aid of heat and pressure, in such a way that the polymer (in the layers 1 and 11) forms a unified, tight, and durable layer, which protects the components well, around the components 6 between the conductor layers 4 and 9. This procedure makes the second conductor layer 9 quite even and flat. The method can, however, also be applied to the manufacture of electronics modules that are not flat.

STAGE G (FIG. 7)

In stage G, the support base 12 is detached or otherwise removed from the structure. The removal can take place, for example, mechanically or by etching. Naturally, stage G can be omitted in embodiments in which a support base 12 is not used. At the start of the following stages, the base is thus essentially the same on both sides.

STAGE H (FIG. 8)

In stage H, holes 17 are made for the contacting vias. The holes 17 are made in both sides of the base, through the conductor layers 4 and 9 and, if necessary, through the adhesive layer 5, in such a way as to reveal the material of the contact terminals 7 and 7' of the components 6. If contacting holes 2 have been made in the conductor layer 4 in stage A and the conductor material of the contact terminals 7 is bare, it will not be essentially to make holes 17 on this side of the base. The holes 17 can be made, for example, by drilling with the aid of a laser. The holes 17 can be aligned, for example, with the aid of the holes 3 or 2.

If contact holes 2 have been made in the conductor layer 4 in an earlier stage, in this stage it will only be necessary to open the holes, in such a way that the contact surfaces of the contact terminals 7 are revealed. After this, the holes 2 are shown merged with the holes 17.

In order to bring the conductor layer 4 and 9 into mutual electrical contact, in stage H it is also possible to make holes 23 for the vias extending through the entire insulating material layer 1. One or more of these can be made at desired location in the base, always depending on the conductor patterning that will be implemented at a later stage. The holes 23 are preferably made like the holes 17, either with the aid of a laser, or by mechanical drilling.

In some embodiments, the desired electrical connection is made by the components 6 and there will be no need to make vias 23. In this case, the desired electrical connection can also mean that there is no electrical contact and 'both sides' of the electronics module operate separately. This can be the case, for example, if the microcircuit 6 being embedded contains two semiconductor chips that are not connected to each other.

The holes 23 can be used in the following stages as alignment markings, in addition to the alignment holes 3 and holes 17. This is advantageous, as the holes 23 extend through the entire base structure, so that they defined the relative positions of the upper and lower surface of the base and can be used quite as well on the lower as on the upper surface of the base.

STAGE I (FIG. 9)

In stage I, conductor material 18 is grown in the holes 17 and possible holes 23 made in stage H, in order to create vias. In the example process, the conductor material is grown at the same time also elsewhere on top of the base, thus increasing the thickness of the insulating layers 4 and 9 too.

The conductor material 18 to be grown can be, for example, copper, or some other sufficiently electrically conductive material. The selection of the conductor material 18 takes into account the ability of the material to form an electrical contact with the material of the contact protrusions 7 and 7' of the component 6. In one example process, the conductor material 18 is mainly copper. The copper metallizing can be performed by depositing a thin layer of chemical copper in the holes 17 and 23 and then continuing plating using an electrochemical copper-growing method. Chemical copper is used, for example, because it will also form a deposit on top of the adhesive and act as an electrical conductor in electrochemical plating. The metal can thus be grown using a wet-chemical method, so that the growing is cheap.

In the example process, the vias 17 are first of all cleaned using a three-stage desmear process. After this, the vias are metallized, in such a way that first a polymer catalyzing SnPd coating is formed, after which a thin layer (about 0.5 µm) of chemical copper is deposited on the surface. The thickness of the copper is increased by electrochemical deposition.

Stage I is intended to form an electrical contact between the component 6 and the conductor layers 4 and/or 9 and possibly directly between the conductor layers 4 and 9. Thus, in stage I it is not essential to increase the thickness of the conductor layers 4 and 9, but instead the process can equally well be designed so that in stage I the holes 17 and 23 are only filled. The conductor layer 18 can be manufactured, for example, by filling the holes 17 with an electrically conductive paste, or by using some other suitable microvia metallizing method.

In the later figures, the conductor layer 18 is shown merged with the conductor layers 4 and 9.

STAGE J (FIG. 10)

In stage J, the desired conductor patterns 14 and 19 are made from the conductor layers 4 and 9 on the surfaces of the base. The conductor patterns 14 and 19 can be made by removing the conductor material of the conductor layer 4 and 9 from outside the conductor patterns. The conductor material can be removed, for example, using some of the patterning and etching methods that are widely used and well known in the circuit-board industry, for example, by etching.

After stage J, the electronics module includes a component 6, or several components 6, as well as conductor patterns 14 and 19, and possible electrical vias 23. With the aid of the conductor patterns 14 and 19 and the vias 23, the components 6 can be connected to an external circuit, or to each other. The preconditions then exist for manufacturing an operational totality. The process can thus be designed in such a way that the electronics module is ready after stage J and FIG. 12 indeed shows an example of one possible electronics module consisting of two component layers.

If desired, the process can also continue after stage J, for example, by coating the electronics module with a protective agent, or by manufacturing additional conductor pattern layers on the first and/or second surface of the electronics module. It is also possible to stack several such electronics modules and thus form modules with several layers, as is described, for example in the same applicant's earlier publications WO 03/065778 and WO 03/065779. Sub-modules of the multi-layer electronics module (the bases 1 with their components 6 and conductors 14 and 19) can be manufactured, for example, using one of the electronic-module manufacturing methods described above. Some, or all of the sub-modules to be attached to the layered structure can, of course, be manufactured quite as well using some other method suitable for the purpose.

According to one preferred embodiment, essentially the same conductor patterns can be made on both surface of the module, so that two or more such modules can be placed on top of each other so that their conductor patterns lie next to each other. The contact patterns can consist of conductor structures 14 and 19 arranged directly on top of the insulating material. The advantage of this embodiment is that some method known in the field can be used to form electrical contact between the contact patterns. In the manner described, it is then possible to manufacture electronics modules, the operationally of which is improved by increasing their dimension by layering in the direction at right angles to the surface of the base. The electronics modules that are placed on top of each other can even be very different operationally. Externally they need not be completely similar, instead one or more of the components smaller units, the contact patterns of which coincide with the contact pattern of a large base at some specific point in the base, can be connected on top of the larger base.

The examples of FIGS. 1-10 show some possible processes, with the aid of which our invention can be exploited. However, our invention is not restricted only to the processes described above, but instead the invention also covers other various processes and their end products, taking into account the full scope and equivalence interpretation of the claims. The invention is also not restricted to only the constructions and methods shown by the examples, but instead it will be obvious to one versed in the art that the various applications of our invention can be used to manufacture very many different kinds of electronics modules and circuit-boards, which differ even greatly from the examples described above. The components and circuits of the figures are thus shown only for the purpose of illustration. Thus many alterations can be made to the processes of the examples described above, without, however, deviating from the basic idea according to the invention. The changes can related, for example, to the manufacturing techniques described in the different stages, or to the mutual order of the process stages.

Our invention can thus also be applied in connection with very many different kinds of known manufacturing methods. For example, publications WO 03/065778 and WO 03/065779 disclose methods for embedding a component in a base, in which the insulating material layer is put on top of a ready patterned conductor layer, before the components are attached. Similarly, the characteristic features of the method disclosed in the publication WO 04/089048, for example, can be applied to the present invention.

In addition, the invention can also be applied in connection with the method and electronics modules disclosed in the same applicant's international patent applications, which are still unpublished at the moment of making the present application. An example that can be given of such a method is the method disclosed in our application FI 20031341, in which manufactured is commenced from an insulating sheet surfaced with a conductor layer on at least one side. A recess is made in the insulation, which opens onto one surface of the sheet, but does not penetrate the conductor layer on the opposite side of the sheet. The component is attached to the recess and electrical contacts are formed between the conductor layer and the contact areas, or contact bumps of the component.

Also the method disclosed in our application FI 20040592, for example, together with its various embodiments for conducting heat away from an embedded component, can be easily and effectively applied to the electronic-module construction according to the present invention and its manufacturing method. In the solution, thermal vias, through which heat is conducted away from the components, are formed in the vicinity of the components, on one or other side of the base. Within the framework of this invention, thermal vias can be created, for example, in the areas between the contact terminals 7 and/or 7', in such a way that they extend to close to the body of the component, or even onto it. In the application referred to, a technique is also described, in which such thermal vias are used to form, for example, a ground contact between the component and the conductor structure 4 or 9. Thus, at least one thermal via is arranged in the insulating-material layer, which can be on either of the sides of the base, which can form an electrical contact directly between the body material of the component, for example, with a semiconductor material, and the conductor structures of the first or second surface of the insulating material layer, for example, in order to form a ground contact. The surface of the component then acts as one contact terminal. Generally the contacts, also the ground contact, are formed, however, through the actual contact terminals in the component.

The invention claimed is:

1. A method for manufacturing an electronics module, in which method at least one component, which has a first contacting surface, in which there are first contact terminals, is embedded inside an insulating-material layer comprising two opposing surfaces, and contacts are made to connect the component electrically from the contact terminals to the conductor structures contained in the electronics module, and the component has a contacting surface opposite to the first contacting surface, in which there is at least one second contact terminal, and contacts are made to electrically connect the component from the contact terminal to the conductor structures contained in the electronics module such that a first conductor layer is arranged on the first surface and a second conductor layer on the second surface of the insulating-material layer and at least one second contact terminal of the component is electrically connected to the second conductor layer, with the aid of conductor material arranged in a contacting hole arranged to the second surface of the insulating-material layer, and wherein the insulating-material layer is a unified layer, consisting of essentially the same material and the distance of the contact surface of the second contact terminal to the patterned conductor structures situated on the second surface of the insulating-material layer is less than the diameter of the contacting hole and the first contacting surface of the component is glued to the first conductor layer.

2. A method according to claim 1, wherein contacting holes and/or alignment holes are made in the first conductor layer before it is arranged on the first surface of the insulating-material layer.

3. A method according to claim 1, and wherein at least part of the insulating-material layer is put on the electronics module after the gluing of the component.

4. A method according to any one of claims 1, 2 and 3, and in which the insulating-material layer is formed of at least two separate material sheets, which are pressed together to form a single unified insulating-material layer.

5. A method according to any one of claims 1, 2 and 3, and in which vias are made to connect the conductor layers electrically to each other.

6. A method according to any one of claims 1, 2 and 3, and in which there are at least two second contact terminals.

7. A method according to any one of claims 1, 2 and 3, and in which at least one second contact terminal is intended to conduct a ground-place potential, signal voltage, or power voltage to the component.

8. A method according to any one of claims 1, 2 and 3 and in which there are at least four second contact terminals.

* * * * *